(12) United States Patent
Bedecarrats et al.

(10) Patent No.: US 12,356,676 B2
(45) Date of Patent: Jul. 8, 2025

(54) DEVICE COMPRISING ELECTROSTATIC CONTROL GATES DISTRIBUTED ON TWO OPPOSITE FACES OF A SEMICONDUCTOR PORTION

(71) Applicant: COMMISSARIAT A L'ENERGIE ATOMIQUE ET AUX ENERGIES ALTERNATIVES, Paris (FR)

(72) Inventors: Thomas Bedecarrats, Grenoble (FR); Jean Charbonnier, Grenoble (FR); Maud Vinet, Grenoble (FR); Hélène Jacquinot, Grenoble (FR); Yann-Michel Niquet, Grenoble (FR); Candice Thomas, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 526 days.

(21) Appl. No.: 17/577,551

(22) Filed: Jan. 18, 2022

(65) Prior Publication Data

US 2022/0271151 A1 Aug. 25, 2022

(30) Foreign Application Priority Data

Jan. 18, 2021 (FR) ..................... 21 00454

(51) Int. Cl.
*H10D 48/00* (2025.01)
*H10D 30/01* (2025.01)
(Continued)

(52) U.S. Cl.
CPC ......... *H10D 48/383* (2025.01); *H10D 30/031* (2025.01); *H10D 30/6734* (2025.01); *H10D 48/385* (2025.01); *H10D 64/01* (2025.01)

(58) Field of Classification Search
CPC ............. H01L 29/66977; H01L 29/401; H01L 29/66742; H01L 29/66984;
(Continued)

(56) References Cited

U.S. PATENT DOCUMENTS

| 2013/0087766 A1 | 4/2013 | Schenkel et al. |
| 2016/0268406 A1* | 9/2016 | Barraud ............ H01L 29/66545 |
| 2020/0185512 A1 | 6/2020 | Voinigescu et al. |

FOREIGN PATENT DOCUMENTS

| WO | WO 2017/213647 A1 | 12/2017 |
| WO | WO-2018057027 A1 * | 3/2018 |
| WO | WO 2018/063203 A1 | 4/2018 |

OTHER PUBLICATIONS

French Preliminary Search Report issued Sep. 24, 2021 in French Application 21 00454 filed on Jan. 18, 2021, 2 pages (with English Translation of Categories of Cited Documents).
(Continued)

*Primary Examiner* — Shahed Ahmed
(74) *Attorney, Agent, or Firm* — Oblon, McClelland, Maier & Neustadt, L.L.P.

(57) ABSTRACT

A spin qubit quantum device includes a semiconductor portion having a first region disposed between two second regions; a first control gate disposed in direct contact with the first region and configured to control a minimum potential energy level in the first region, and disposed in direct contact with a first face of the semiconductor portion; and second electrostatic control gates, each disposed in direct contact with one of the second regions and configured to control a maximum potential energy level in one of the second regions, and disposed in direct contact with a second face, opposite to the first face, of the semiconductor portion, The first gate is not aligned with the second gates.

17 Claims, 5 Drawing Sheets

(51) Int. Cl.
*H10D 30/67* (2025.01)
*H10D 64/01* (2025.01)

(58) Field of Classification Search
CPC .......... H01L 29/78648; H01L 29/7613; H01L 29/42312; H01L 27/1203; H01L 29/78–7926; B82Y 10/00; G06N 99/002; H03K 19/195–1958; H03K 17/92; H10N 60/00; H10N 60/99; H10N 99/05; H10D 48/383; H10D 30/6734; H10D 48/385; H10D 64/01; H10D 48/3835; H10D 30/402; H10D 64/311
See application file for complete search history.

(56) References Cited

OTHER PUBLICATIONS

S. De Franceschi et al., "SOI technology for quantum information processing", 2016 IEEE International Electron Devices Meeting (IEDM), San Francisco, CA, 2016, pp. 13.4.1-13.4.4.
C. H. Yang et al., "Dynamically controlled charge sensing of a few-electron silicon quantum dot", AIP Advances, 1, 2011, 7 pages.
R. Pillarisetty et al., "Qubit Device Integration Using Advanced Semiconductor Manufacturing Process Technology", IEDM18, pp. 133-136.

* cited by examiner

DEVICE COMPRISING ELECTROSTATIC CONTROL GATES DISTRIBUTED ON TWO OPPOSITE FACES OF A SEMICONDUCTOR PORTION

TECHNICAL FIELD AND PRIOR ART

The invention relates to the field of devices with electrostatic control gates. The invention especially relates to the field of quantum devices, quantum information processing and quantum computing, as well as to the field of CMOS devices used in a cryostat at cryogenic temperatures (below 1 K or even below 4 K).

Quantum computing is based on the use of a measurable two-level quantum state as an information vector, called a qubit or quantum bit, and the laws of quantum mechanics (superposition, entanglement, measurement) in order to execute algorithms. A quantum device with one or more spin qubits allows the manipulation of the quantum state of these qubit(s).

The spin qubits can be formed in a semiconductor material, advantageously silicon. Semiconductor technologies are being investigated for making qubits because of their high integration potential, similar to classical electronics. Electrons or holes are individually confined in quantum wells located in a cryostat at cryogenic temperatures and made within nanometer-sized electrostatically defined confinement structures and, in the case of silicon, with an architecture close to that of MOSFETs. These confinement structures correspond to quantum dots, also known as qdots. A quantum dot behaves like a potential well confining one or more elementary charges (electrons or holes) in a semiconductor region.

The application of a static magnetic field (for example of between 100 mT and 1 T) enables spin degeneracy of the quasiparticles to be removed. Consequently, each quasiparticle constitutes a quantum system with two measurable levels called "spin down" and "spin up". Their quantum state is a superposition of these two states represented by the direction of an arrow within a sphere, called a Bloch sphere. The manipulation (rotation) of these spins is carried out using an alternating component of the magnetic field (with a frequency of, for example, between 1 GHz and several tens of GHz) or using an alternating electric field at the same frequencies in the case of a sufficient spin-orbit interaction (case of holes in silicon). Spin reading (up or down) allows part of the quantum information to be extracted according to its probability of being in each state, determined by the quantum superposition.

To optimally control several quantum dots formed side by side in the same semiconductor portion, it is necessary to be able to adjust the energy depth of each of the quantum dots in the semiconductor, that is the minimum potential energy level of each of the quantum dots, as well as the energy height of the tunnel barriers, or tunnel effect barriers, that is the maximum potential energy level of each of the tunnel barriers, which separate the quantum dots, independently.

Controlling the height of the tunnel barriers and the minimum potential of each quantum dot is achieved by means of voltages applied to independent electrostatic control gates. The solutions provided so far consist in defining control gates positioned directly above each quantum dot and each tunnel barrier. The pitch with which the control gates positioned above the quantum dots are made, as well as that with which the control gates positioned above the tunnel barriers are made, is between 40 nm and 160 nm.

A significant restriction for making such a quantum device is that the height of the tunnel barriers and the minimum potential of each quantum dot have to be defined and controlled with a good accuracy, for example in the order of 100 μV. To achieve such accuracy, the material of which the quantum dots are made does not have to be degraded by the presence of residual dopants that behave as potential wells (a single dopant can induce a very localised disorder in the order of 200 mV). Furthermore, the defect density at the interfaces of the different materials of the quantum device, for example those located at the interface between the $SiO_2$ of the control gate dielectrics and the silicon of the quantum dots, has to be minimised. For example, making dielectrics for control gates by thermal oxidation of the silicon forming the quantum dots allows defect densities in the order of $10^{10}$ defects/eV/cm$^{-2}$ to be obtained, unlike oxides obtained by plasma oxidation or by low temperature deposition the defect densities of which are between $10^{11}$ and $10^{12}$ defects/eV/cm$^{-2}$.

In order to precisely define and control height of the tunnel barriers and the minimum potential of the or each quantum dot, document of S. De Franceschi et al, "SOI technology for quantum information processing," 2016 IEEE International Electron Devices Meeting (IEDM), San Francisco, CA, 2016, pp. 13.4.1-13.4.4, suggests to modify the electric field in a silicon nanowire forming the quantum dots, and thus modify the height of the tunnel barriers between the quantum dots or the minimum potential of the quantum dots, by applying a voltage to the substrate situated on the back face of the silicon layer forming the quantum dots and serving in this case as a back gate. A first drawback of this solution is that the back gate is common to the entire quantum device and does not allow the height of each of the tunnel barriers to be modulated individually. A second drawback of this solution is that, in order to limit the presence of residual dopants, the substrate is not doped, which implies that the bias applied by the substrate is not effective at a low temperature.

In the field of CMOS devices made from FDSOI (for fully-depleted silicon on insulator) substrates, it is known to make back gates by locally implanting dopants in regions of the thick layer of the substrate. However, this technique is not suitable for making back gates for quantum devices. Indeed, for these back gates to be conductive at low temperature, the doping made has to be greater than approximately $5 \cdot 10^{18}$ at/cm$^2$ at the interface between the thick layer and the buried dielectric layer of the substrate. But such a high dopant concentration requires implantation profiles that leave residual dopants in the thin silicon layer of the substrate. In addition, the dimensions of the back gates and the spaces between these back gates are larger than 1 μm, which is not compatible with the target dimensions for quantum devices. Finally, the potential differences between the gates are limited so that the doping-formed diodes are not connected directly and the breakdown voltages between 1 V and 2.5 V are not exceeded.

Other documents describe making of quantum devices from bulk silicon substrates and in which the height of tunnel barriers and minimum potential of each quantum dot are controlled by distinct gates. The document by C. H. Yang et al, "Dynamically controlled charge sensing of a few-electron silicon quantum dot", AIP Advances, 1, 042111, 2011, describes for example making of such gates by implementing two or three successive lithography cycles, with partial overlap of the different levels to manage misalignment issues. The document by R. Pillarisetti et al, IEDM 18, provides making of such gates in a self-aligned manner.

However, the drawback of these solutions, apart from the complexity of the manufacturing methods to be implemented, is that the gates controlling the height of the tunnel barriers are strongly capacitively coupled to those controlling the minimum potential of the quantum dots due to the large areas of gates facing each other. Furthermore, the gate dielectrics cannot be made by thermal oxidation and cannot be made with equivalent electrical properties.

Similar problems to those set forth above for quantum devices arise for CMOS devices used in a cryogenic environment.

DISCLOSURE OF THE INVENTION

There is therefore a need to provide an electrostatic control gate device that does not have the drawbacks of prior art.

To this end, one embodiment provides a device comprising at least:
- a semiconductor portion comprising at least one first region disposed between at least two second regions and juxtaposed to the two second regions;
- a first electrostatic control gate disposed in direct contact with the first region of the semiconductor portion, configured to control a minimum potential energy level in the first region, and comprising at least one first portion of electrically conductive material and at least one first gate dielectric disposed in direct contact with a first face of the semiconductor portion, between the first face and the first portion of electrically conductive material;
- second electrostatic control gates, each disposed in direct contact with one of the second regions of the semiconductor portion and configured to control a maximum potential energy level in one of the second regions and each comprising at least one second portion of electrically conductive material and at least one second gate dielectric disposed in direct contact with a second face, opposite to the first face, of the semiconductor portion, between the second face and the second portion of electrically conductive material,
- and wherein, in a plane parallel to the first and second faces, a first straight line perpendicular to the first and second faces and passing through a centre of the first electrostatic control gate is separated from each second straight line perpendicular to the first and second faces and passing through a centre of one of the second electrostatic control gates by a non-zero distance $d_1$.

Here, the device corresponds to a spin qubit quantum device.

In this device, it is provided to make the first electrostatic control gate(s) (which control the minimum potential energy level in the first region(s) of the semiconductor portion) on the side of a face of the semiconductor portion opposite to that on the side of which the second electrostatic control gates (which control the maximum potential energy level in the second regions of the semiconductor portion) are disposed.

By means of this arrangement of the first and second electrostatic control gates, the method for manufacturing the device is simplified, especially because the dimensional restrictions relating to these gates are reduced with respect to the case where all the electrostatic control gates would be on the same side of the semiconductor portion.

Additionally, this arrangement does not involve the implementation of steps degrading the material in which the first and second regions are present due to the presence of residual dopants, and/or generating large defect densities at the interfaces of the different materials of the device.

This method also allows the first and second gate dielectrics to be made by thermal oxidation, which is a technique that generates low defect densities at the interfaces of the gate dielectrics thus made, and allows good electrical properties to be obtained.

In addition, unlike prior art quantum devices using the substrate to control the maximum potential energy level in several semiconductor regions, forming for example tunnel barriers, the presence of the second electrostatic control gates allows for individual modulation of the maximum potential energy levels in several semiconductor regions when each of the second electrostatic control gates is electrically coupled to a contact which is peculiar or dedicated thereto.

Furthermore, this device corresponds to a quantum device, which is effective at any operating temperature, especially at a low temperature.

This arrangement of the electrostatic control gates on each side of the semiconductor portion also avoids the strong capacitive couplings obtained when all the control gates are situated on the same side of the semiconductor portion.

In addition, the restrictions on the dimensions of the electrostatic control gates are less than when they are disposed on a same side of the semiconductor portion.

When the device corresponds to a quantum device, this arrangement of the first and second electrostatic control gates makes it possible to define and control the height of the tunnel barriers, formed in the second regions of the semiconductor portion, and the minimum potential of the or each quantum dot, formed in the first region(s) of the semiconductor portion, with a very good accuracy, for example in the order of 100 µV.

According to a first embodiment:
- the device may correspond to a quantum device;
- the first region of the semiconductor portion may be configured to form a quantum dot of a first spin qubit of the device;
- the second regions of the semiconductor portion may be configured to form tunnel barriers between which the quantum dot of the first spin qubit is disposed.

The quantum device can be used with hole spins and/or electron spins.

In this quantum device, the gate dielectrics do not correspond to tunnel oxides, that is do not allow charges to pass therethrough by tunnel effect.

In this first embodiment, the device may further comprise electrical charge carrier reservoirs between which the first region(s) and second regions of the semiconductor portion are disposed.

According to one particular configuration, the distance $d_1$ may be greater than or equal to about 10 nm. This configuration ensures that there is sufficient spacing between the first electrostatic control gate and each of the second electrostatic control gates.

In this case, the distances $d_1$, in the plane parallel to the first and second faces of the semiconductor portion, between the first straight line and each of the second straight lines may be equal. Thus, the first electrostatic control gate is disposed at an equal distance from each of the second electrostatic control gates being situated on either side of the first electrostatic control gate.

Advantageously, the second electrostatic control gates can be made with a repetition pitch of between 40 nm and 80 nm.

According to one particular configuration, a distance $d_2$, in the plane parallel to the first and second faces of the semiconductor portion, between a straight line perpendicular to the first and second faces of the semiconductor portion and passing through a side edge of the first portion of electrically conductive material, and a straight line perpendicular to the first and second faces of the semiconductor portion and passing through a side edge of the second portion of electrically conductive material of one of the second electrostatic control gates, may be between 0 and 20 nm. In this particular configuration, the smallest spacing between two flanks of different gates (first and second electrostatic control gates) may be between 0 and 20 nm. This advantageous configuration allows for a partial, but limited, overlap of the regions of the semiconductor portion the potential of which is controlled by the first and second electrostatic control gates, or an equally limited spacing of these regions. This configuration prevents the operation of the second control gates from affecting the operation of the first control gate(s).

The device may be such that:
  the semiconductor portion comprises several distinct first regions and each disposed between at least two second regions of the semiconductor portion, each first region being separated from an adjacent first region by one of the second regions;
  several first electrostatic control gates each disposed in direct contact with one of the first regions of the semiconductor portion and configured to control a minimum potential energy level in said one of the first regions of the semiconductor portion.

When the device corresponds to a quantum device, this configuration allows for several spin qubits to be aligned in a same semiconductor portion.

Advantageously, the first electrostatic control gates may be made with a repetition pitch of between 40 nm and 80 nm.

The semiconductor portion may correspond to a semiconductor nanowire.

In one particular configuration, the first regions may be arranged forming a first two-dimensional array in the semiconductor portion and the second regions may be arranged forming a second two-dimensional array in the semiconductor portion.

The device may further comprise means for applying at least one first electrical potential to each of the first portions of electrically conductive material and at least one second electrical potential, of a value independent of that of the first electrical potential, to each of the second portions of electrically conductive material.

The thickness of the semiconductor portion may be between 10 nm and 20 nm, or between 10 nm and 15 nm, and/or the thickness of each of the first and second gate dielectrics may be between 2 nm and 15 nm, or between 2 nm and 10 nm, or even between 2 nm and 5 nm.

According to a second embodiment, the device may correspond to a CMOS device.

A method for making a device is also provided, comprising at least:
  making at least one semiconductor portion comprising at least one first region disposed between at least two second regions of the semiconductor portion and juxtaposed to the two second regions;
  making a first electrostatic control gate disposed in direct contact with the first region of the semiconductor portion, configured to control a minimum potential energy level in the first region, and comprising at least one first portion of electrically conductive material and at least one first gate dielectric disposed in direct contact with a first face of the semiconductor portion, between the first face and the first portion of electrically conductive material;
  making second electrostatic control gates, each disposed in direct contact with one of the second regions of the semiconductor portion and configured to control a maximum potential energy level in one of the second regions, and each comprising at least one second portion of electrically conductive material and at least one second gate dielectric disposed in direct contact with a second face, opposite to the first face, of the semiconductor portion, between the second face and the second portion of electrically conductive material,
  and wherein the first and second electrostatic control gates are made such that, in a plane parallel to the first and second faces, a first straight line perpendicular to the first and second faces and passing through a centre of the first electrostatic control gate is separated from each second straight line perpendicular to the first and second faces and passing through a centre of one of the second electrostatic control gates by a non-zero distance $d_1$.

According to one particular configuration, the first electrostatic control gate and the second electrostatic control gates may be made by implementing the following steps of:
  making the first gate dielectric and the first portion of electrically conductive material of the first electrostatic control gate on the first face of the semiconductor portion that forms part of a first substrate;
  depositing at least one first dielectric layer covering the first electrostatic control gate and parts of the first face of the semiconductor portion not covered with the first electrostatic control gate;
  securing the first dielectric layer with a second dielectric layer of a second substrate;
  removing the first substrate so as to expose the second face of the semiconductor portion;
  making the second gate dielectric and the second portion of electrically conductive material of each of the second electrostatic control gates on the second face of the semiconductor portion.

The first and second gate dielectrics may be made by implementing thermal oxidation of the semiconductor portion.

BRIEF DESCRIPTION OF THE DRAWINGS

The present invention will be better understood upon reading the description of examples of embodiments given purely by way of indication and in no way limiting with reference to the appended drawings in which.

Identical, similar or equivalent parts of the different figures described hereinafter bear the same reference numerals so as to facilitate switching from one figure to another.

The different parts represented in the figures are not necessarily in a uniform scale, in order to make the figures more legible.

The different possibilities (alternatives and embodiments) should be understood as not being exclusive of each other and may be combined with each other.

DETAILED DESCRIPTION OF PARTICULAR EMBODIMENTS

A quantum device 100 according to a first embodiment is described below in connection with FIGS. 1 and 2.

The device 100 comprises a semiconductor portion 102. The semiconductor of the portion 102 corresponds, for example, to silicon and/or SiGe, regardless of their isotopes. The portion 102 may also correspond to a stack of several different semiconductors, for example a stack of silicon and SiGe.

In the example embodiment described herein, the portion 102 corresponds to a nanowire comprising the following characteristics:
- thickness (dimension along axis Z) of between about 5 nm and 200 nm, and advantageously between 10 nm and 20 nm, or advantageously between 10 nm and 15 nm;
- width (dimension along axis Y) of between about 20 nm and 120 nm, preferentially 40 nm;
- length (dimension along axis X) of between about 300 nm and 100 µm depending on the number of qubits desired in the portion 102.

The semiconductor portion 102 comprises at least one first region 104 against which at least one first electrostatic control gate 107 is disposed. This first electrostatic control gate 107 comprises at least one first portion of electrically conductive material 108 and at least one first gate dielectric 110 disposed between a first face 112 of the semiconductor portion 102 and the first portion of electrically conductive material 108.

The first region 104 is disposed between at least two second regions 106 of the semiconductor portion 102 against which second electrostatic control gates 109 are disposed, each disposed against one of the second regions 106 of the semiconductor portion 102. Each of the second electrostatic control gates 109 comprises at least one second portion of electrically conductive material 114 and at least one second gate dielectric 116 disposed between a second face 118, opposite to the first face 112, of the semiconductor portion 102 and the second portion of electrically conductive material 114 of the second electrostatic control gate 109.

In the example embodiment described, the first and second gate dielectrics 110, 116 each have a thickness of between 2 nm and 15 nm, or between 2 nm and 10 nm, or even between 2 nm and 5 nm, for example equal to 5 nm. Furthermore, the first and second gate dielectrics 110, 116 comprise for example a good quality semiconductor oxide, advantageously made by thermal oxidation, for example $SiO_2$.

In the example embodiment described, the first and second portions of electrically conductive material 108, 114 each have a thickness of between 5 nm and 40 nm, for example equal to 10 nm, and comprise for example degenerate doped polysilicon and/or TiN and/or Ta and/or Al. Each of the first and second portions of electrically conductive material 108, 114 may comprise a stack of several materials, for example metal materials (TiN, Ta, Al, etc.) and/or polysilicon.

Figure 1:
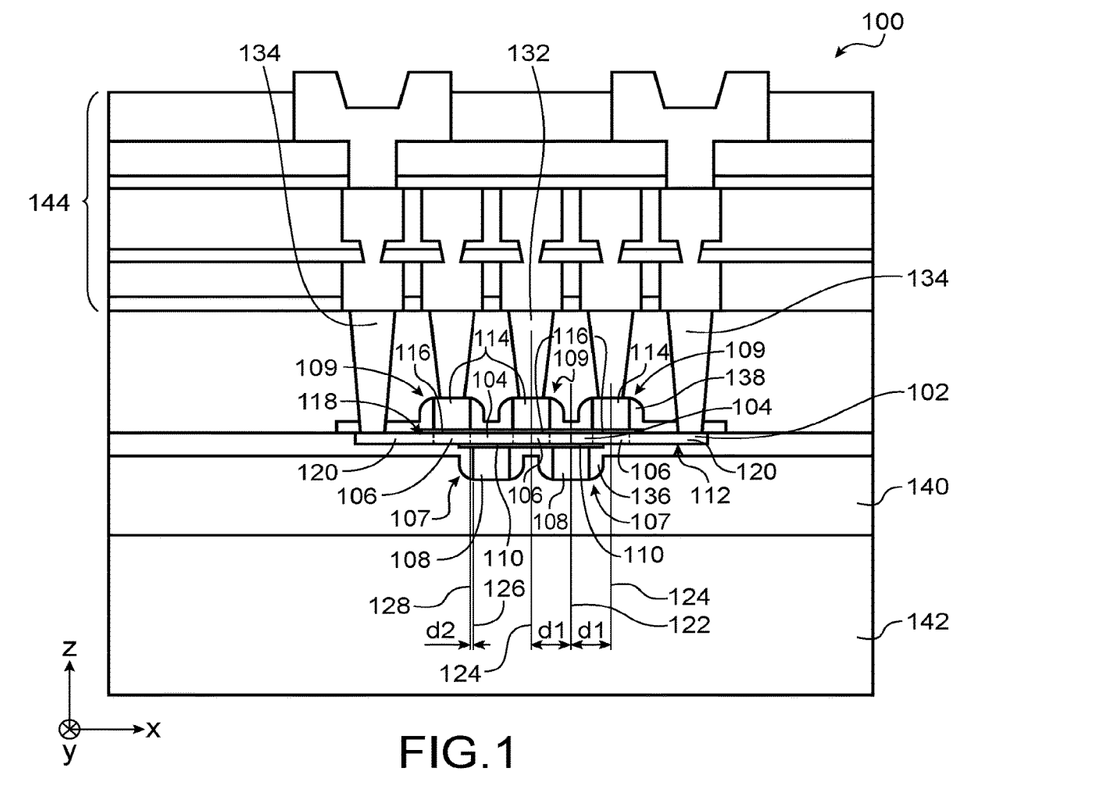
FIGS. 1 and 2 schematically represent cross-sectional views of a quantum device according to a first embodiment.
Figure 2:
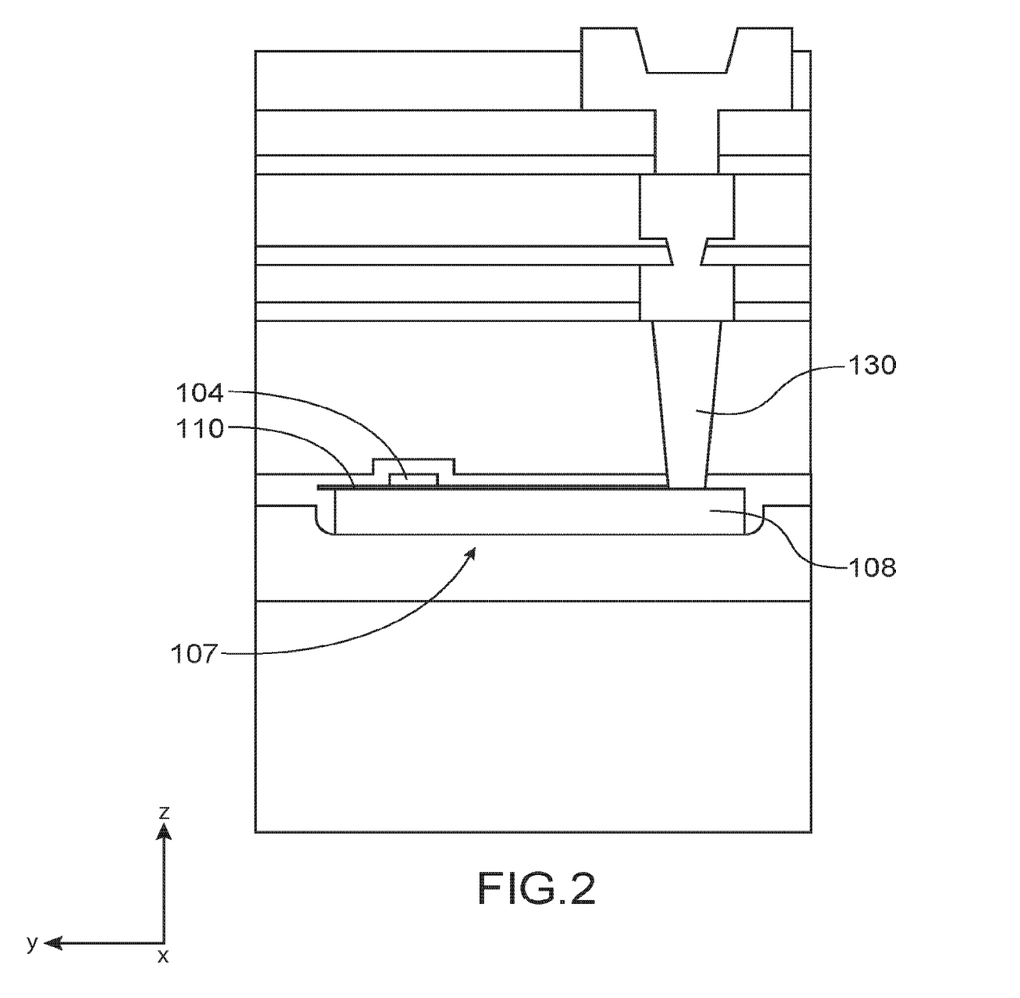

Advantageously, and as is the case in the example embodiment of FIGS. 1 and 2, the device 100 comprises several first regions 104 (two in FIG. 1) such that two neighbouring first regions 104 are separated by one of the second regions 106.

The first region(s) 104 and the second regions 106 of the semiconductor portion 102 are aligned in a direction that is parallel to the length of the nanowire formed by the semiconductor portion 102 (parallel to the axis X in FIGS. 1 and 2). In FIG. 1, the first regions 104 are symbolically delimited from the second regions 106 by dotted lines.

The first and/or second electrostatic control gates 107, 109 are made with a repetition pitch of between 40 nm and 200 nm, and advantageously between 40 nm and 80 nm.

The first electrostatic control gates 107 are not aligned, along a direction perpendicular to the first and second faces 112, 118 of the semiconductor portion 102, with the second electrostatic control gates 109. For example, considering a first electrostatic control gate 107 disposed under a first region 104 and a second electrostatic control gate 109 disposed on a second region 106 adjacent to the first region 104, a distance $d_1$, in a plane parallel to the first and second faces 112, 118 (corresponding to the plane (X,Y) in FIGS. 1 and 2), between a first straight line 122 perpendicular to the first and second faces 112, 118 and passing through the centre of the first electrostatic control gate 107, and a second straight line 124 perpendicular to the first and second faces 112, 118 and passing through the centre of the second electrostatic control gate 109, is greater than or equal to about 10 nm. Advantageously, the distances $d_1$, in the plane parallel to the first and second faces 112, 118, between the first straight line 122 and each of the second straight lines 124 being situated on either side of the first straight line 122 are equal.

The first and second electrostatic control gates 107, 109 may be made such that their edges overlap or do not overlap a same region of the portion 102. Thus, considering a first electrostatic control gate 107 disposed under a first region 104 and a second electrostatic control gate 109 disposed on a second region 106 adjacent to the first region 104, a distance $d_2$, in a plane parallel to the first and second faces 112, 118, between a straight line 126 perpendicular to the first and second faces 112, 118 and passing through a side edge of the first portion of electrically conductive material 108 of the first electrostatic control gate 107, and a straight line 128 perpendicular to the first and second faces 112, 118 and passing through a side edge of one of the second portions 114 situated on the side of the first portion of electrically conductive material 108, is between 0 and 20 nm, or advantageously between 0 and 10 nm. In other words, considering the projections of these first and second portions 108, 114 into a same plane parallel to the first and second faces 112, 118, these projections may partially overlap each other over a distance of between 0 and 20 nm or between 0 and 10 nm, or on the contrary be distant from each other and separated by a distance of between 0 and 20 nm or between 0 and 10 nm.

The first and second regions 104, 106 of the semiconductor portion 102 are disposed between third regions 120 of the semiconductor portion 102 which, in the example of FIGS. 1 and 2, correspond to ends of the semiconductor portion 102.

The device 100 further comprises means for applying at least one first electrical potential to each of the first portions of electrically conductive material 108 and at least one second electrical potential, of value independent of that of the first electrical potential, to each of the second portions of electrically conductive material 114.

To this end, in the example embodiment described herein, the device 100 includes one or more first electrical contacts 130 (only one first electrical contact 130 is visible in FIG. 2) electrically connected to the first portions of electrically conductive material 108. Advantageously, each of the first portions of electrically conductive material 108 is connected to a first electrical contact 130 independent of the other first electrical contacts 130.

The device 100 also includes one or more second electrical contacts 132 electrically connected to the second portions of electrically conductive material 114. Advantageously, each of the second portions of electrically conductive material 114 is connected to a second electrical contact 132 independent of the other second electrical contacts 132.

Finally, the device 100 also includes third electrical contacts 134 electrically connected to the electrical charge carrier reservoirs 120.

The electrical contacts 130, 132 and 134 comprise for example at least one metal and/or polysilicon.

The first electrostatic control gates 107 are covered with at least one first dielectric layer 136 comprising for example silicon nitride, and the second electrostatic control gates 109 are covered with at least one second dielectric layer 138 comprising for example silicon nitride. The materials of the first and second dielectric layers 136, 138 may be selected so as to serve, upon making the device 100, as etch stop materials. In addition, these dielectric layers 136, 138 also serve to form dielectric spacers covering the side flanks of the first and second electrostatic control gates 107, 109.

The first dielectric layer 136 is in contact with a dielectric layer 140 comprising for example $SiO_2$ and resting on a substrate 142 comprising for example semiconductor. The second dielectric layer 138 is covered with one or more electrical interconnection levels 144 through which the electrical contacts 130, 132, 134 are made.

The device 100 thus includes, in this first embodiment, at least one first spin qubit made in the semiconductor portion 102 and comprising a quantum dot formed in the first region 104 of the semiconductor portion 102 and disposed between at least two tunnel barriers each formed in one of the second regions 106 of the semiconductor portion 102. The first electrostatic control gate 107 is configured to control a minimum potential energy level of the quantum dot of the first qubit, and the second electrostatic control gates 109 are each configured to control a maximum potential energy level of one of the tunnel barriers. The first electrostatic control gates 107 are not intended to modulate potentials of the same regions of the semiconductor portion 102 as the second electrostatic control gates 109.

The device 100 also includes electrical charge carrier reservoirs formed by the third regions 120 and between which the quantum dot(s) and tunnel barriers are disposed.

Advantageously, and as is the case in FIGS. 1 and 2, the device 100 includes several spin qubits including the first spin qubit, formed side by side in the semiconductor portion 102. In the example embodiment of FIGS. 1 and 2, these spin qubits are aligned along a direction parallel to the axis X. Each qubit comprises a quantum dot formed in one of the first regions 104 of the semiconductor portion 102 distinct from that of the other spin qubits and disposed between at least two tunnel barriers each formed in a second region 106 of the semiconductor portion 102 distinct from that of the other tunnel barriers. Each quantum dot is separated from a neighbouring quantum dot by one of the tunnel barriers. In the example embodiment represented in FIGS. 1 and 2, two spin qubits are represented.

Given that each quantum dot is disposed between two tunnel barriers, the device 100 includes an odd number of tunnel barriers when it includes an even number of quantum dots, and the device 100 includes an even number of tunnel barriers when it includes an odd number of quantum dots.

When the device 100 includes several spin qubits, as is the case in the example embodiment shown in FIGS. 1 and 2, the device 100 includes several first electrostatic control gates 107 each disposed against the first region 104 of the semiconductor portion 102 of one of the spin qubits and configured to control a minimum potential energy level of the quantum dot of that spin qubit.

When each of the first portions of electrically conductive material 108 is connected to a first electrical contact 130 independent of the other first electrical contacts 130, it is possible to individually control the minimum potential energy level of the quantum dot of each qubit. When each of the second portions of electrically conductive material 114 is connected to a second electrical contact 132 independent of the other second electrical contacts 132, it is possible to individually control the maximum potential energy level of each of the tunnel barriers.

In the configuration previously described in connection with FIGS. 1 and 2, the first electrostatic control gates 107 controlling the minimum potential energy levels of the quantum dots are disposed on the side of the substrate 142, and the second electrostatic control gates 109 controlling the maximum potential energy levels of the tunnel barriers are disposed on the side of the electrical interconnection level(s) 144. Alternatively, it is possible that the arrangement of the first and second electrostatic control gates 107, 109 on the portion 102 is reversed, that is the first electrostatic control gates 107 are disposed on the side of the electrical interconnection level(s) 144, and the second electrostatic control gates 109 are disposed on the side of the substrate 142.

A method for making the quantum device 100 according to the first embodiment is described below in connection with FIGS. 3 to 9.

Figure 3:
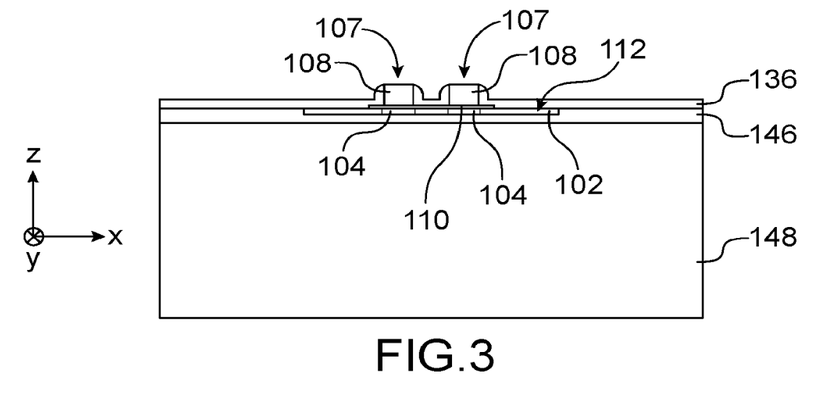
FIGS. 3 to 9 schematically represent steps of a method for making the quantum device according to the first embodiment.

The device 100 is made from a semiconductor layer which, in the example embodiment described here, corresponds to the surface layer of a substrate of the semiconductor-on-insulator type, and more particularly of the SOI ("Silicon-On-Insulator") type. The semiconductor layer here comprises silicon and is disposed on a buried dielectric layer 146, or BOX (Buried Oxide) of the SOI substrate comprising $SiO_2$. The buried dielectric layer 146 is disposed on a substrate layer 148 serving as a support, here comprising silicon.

The semiconductor layer is etched to obtain the portion 102 corresponding to the remaining portion of the semiconductor layer after this etching. For this, a first etch mask, comprising for example a resin, is deposited onto the semiconductor layer, and then lithography and etching are implemented so that the remaining semiconductor portion corresponds to the portion 102 in which the quantum dots and tunnel barriers of the device 100 will be made. The first etch mask is then removed.

Alternatively, it is possible that the above-described steps of etching the semiconductor layer are not implemented when the quantum dots of the device 100 are made directly in the semiconductor layer.

A stack of material layers for making the first electrostatic control gate(s) 107 is then formed by covering the first face 112 of the portion 102 and the parts of the dielectric layer 146 not covered with the portion 102. This stack comprises at least one dielectric layer for making the first gate dielectric(s) 110, and at least one electrically conductive layer for making the first portion(s) of electrically conductive material 108. In order to be able to etch this stack of layers and form the first electrostatic control gate(s) 107, a hard mask layer, corresponding for example to a SiN layer having thickness equal to 30 nm, is deposited onto this stack.

Advantageously, the dielectric layer of the stack is obtained by implementing a thermal oxidation of the first face 112 of the portion 102.

A second etch mask is then deposited onto the hard mask layer, the pattern of which corresponds to that of the first electrostatic control gate(s) 107 to be made. The hard mask layer and the stack of material layers for making the first electrostatic control gate(s) 107 are then subjected to lithography and etching according to the pattern of the second etch mask. The remaining portions of these layers correspond to the first portion(s) of electrically conductive material 108 and the first gate dielectric(s) 110. The stop of this etch may be defined by the dielectric layer 146 serving in this case as the etch stop layer.

Making the first electrostatic control gate(s) 107 defines the locations, in the portion 102, of the first region(s) 104 for forming the quantum dots and which correspond to the region(s) of the portion 102 covered with the first electrostatic control gate(s) 107.

The first dielectric layer 136, comprising, for example, semiconductor nitride such as silicon nitride, is deposited onto the structure made, covering the first electrostatic control gate(s) 107, the parts of the portion 102 not covered with the first electrostatic control gate(s) 107 and any parts of the dielectric layer 146 not covered with the portion 102 and with the first electrostatic control gate(s) 107.

The structure obtained at this stage of the method is represented in FIG. 3.

Figure 4:
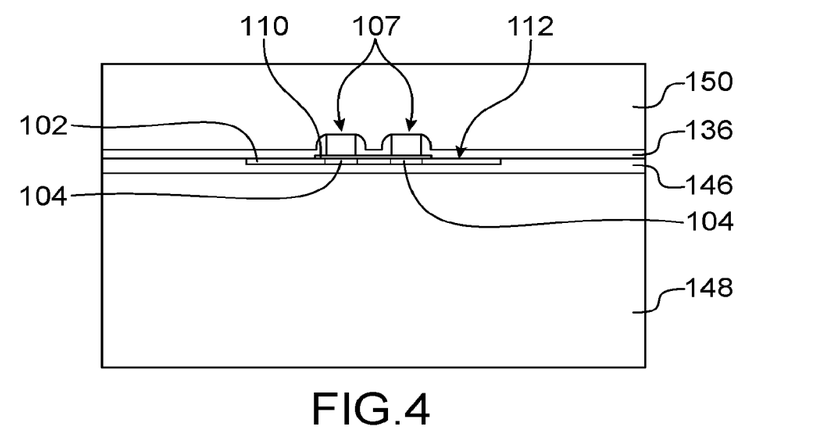

In FIG. 4, a dielectric layer 150 is then deposited by covering the first dielectric layer 136, and then planarised.

Figure 5:
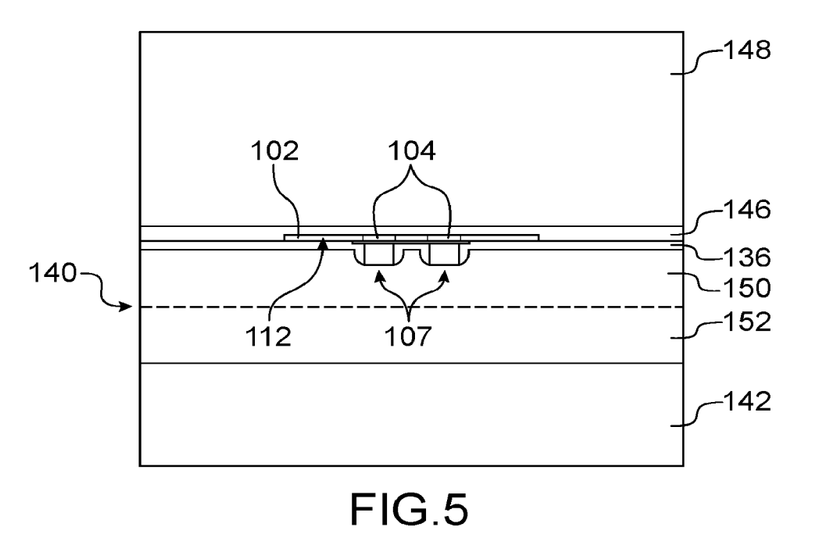

In FIG. 5, the resulting structure is turned around and secured to a second substrate corresponding to substrate 142. In the example embodiment described here, this securement is achieved by direct bonding or molecular bonding between the dielectric layer 150 and another dielectric layer 152, comprising for example semiconductor oxide, formed on one face of the substrate 142. The dielectric layers 150 and 152 together form the dielectric layer 140 previously described in connection with FIGS. 1 and 2.

Figure 6:
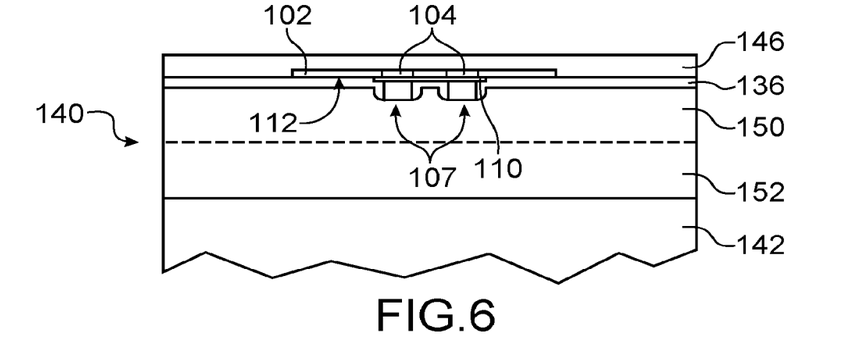
Figure 7:
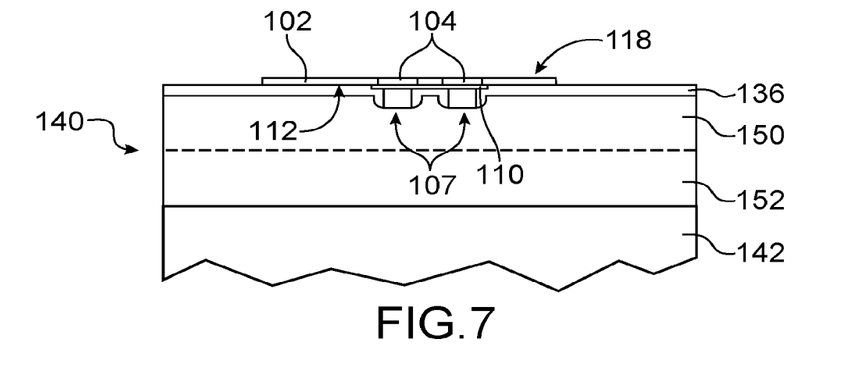

In FIG. 6, the layer 148 of the first substrate is then removed, for example by mechanical abrasion and chemical etching selective to the material of the buried dielectric layer 146. Where the buried dielectric layer 146 comprises $SiO_2$ and the layer 148 comprises silicon, a TMAH solution can be used for this selective etching. In FIG. 7, the buried dielectric layer 146 is then removed, the first dielectric layer 136 being used here as an etch stop layer for this removal. This removal enables the second face 118 of the portion 102 to be exposed.

At this stage of the method, it is possible to perform doping of the third regions 120 by ion implantation. A step of lithography for a masking layer is in this case implemented, prior to the ion implantation, to mask the portions of the portion 102 that are not to be doped.

Figure 8:
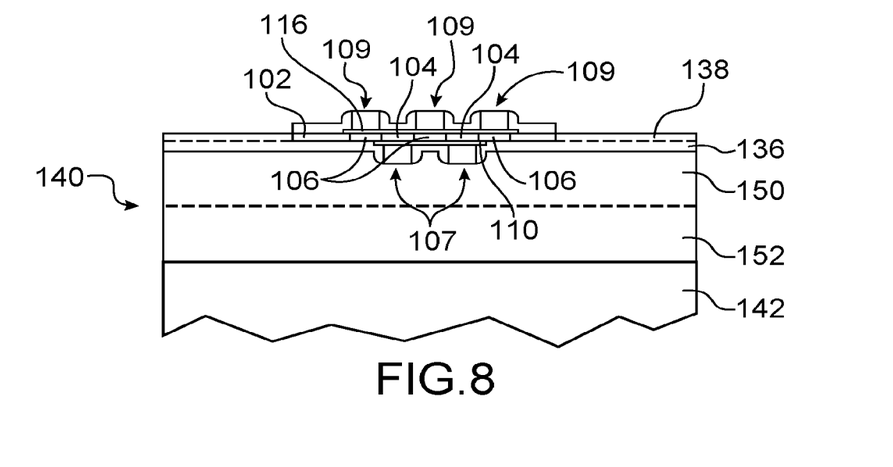

In FIG. 8, the second electrostatic control gates 109 are then made on the second face 118 of the portion 102, defining the locations of the second regions 106 of the portion 102. The second electrostatic control gates 109 are then covered with the second dielectric layer 138, comprising for example a dielectric material similar to that of the first dielectric layer 136.

Figure 9:
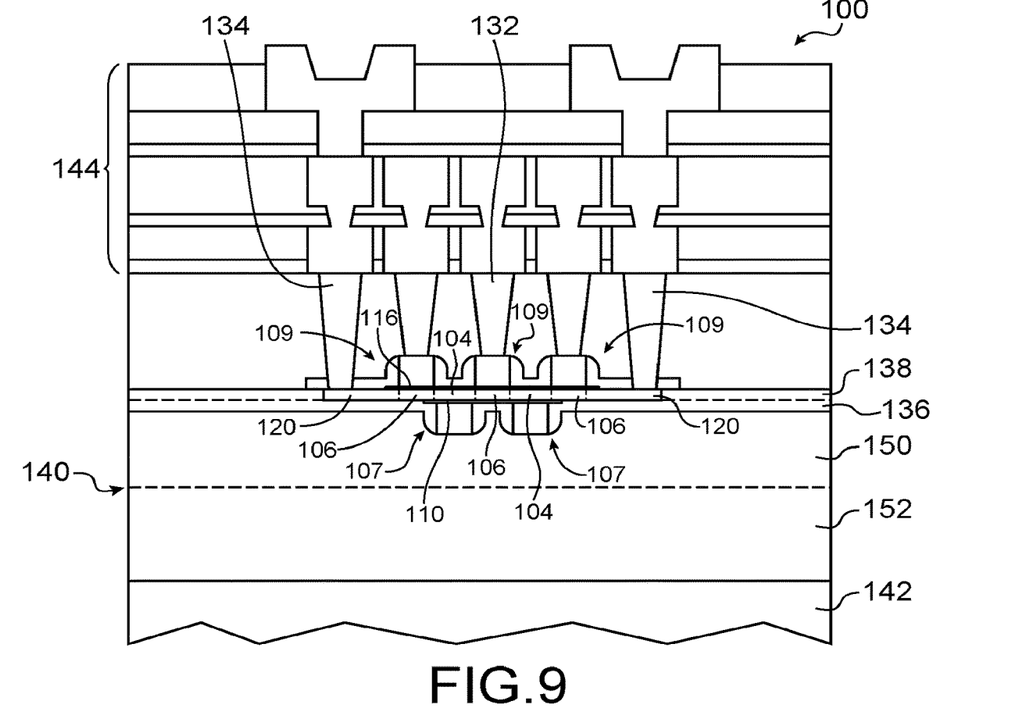

The device 100 is then completed, in FIG. 9, by making the electrical interconnection level(s) 144 as well as the electrical contacts 130, 132 and 134. The device 100 obtained corresponds to that previously described in connection with FIGS. 1 and 2.

As an alternative to the method described above, it is possible that the doping of the third regions 120 is made between deposition of the second dielectric layer 138 and making of the electrical interconnection level(s) 144, by ion implantation or in-situ doped epitaxial growth. A lithography step is in this case implemented, prior to the ion implantation or epitaxial growth, to etch parts of the second dielectric layer 138 covering the third regions 120 and thereby make the third regions 120 accessible.

Figure 10:
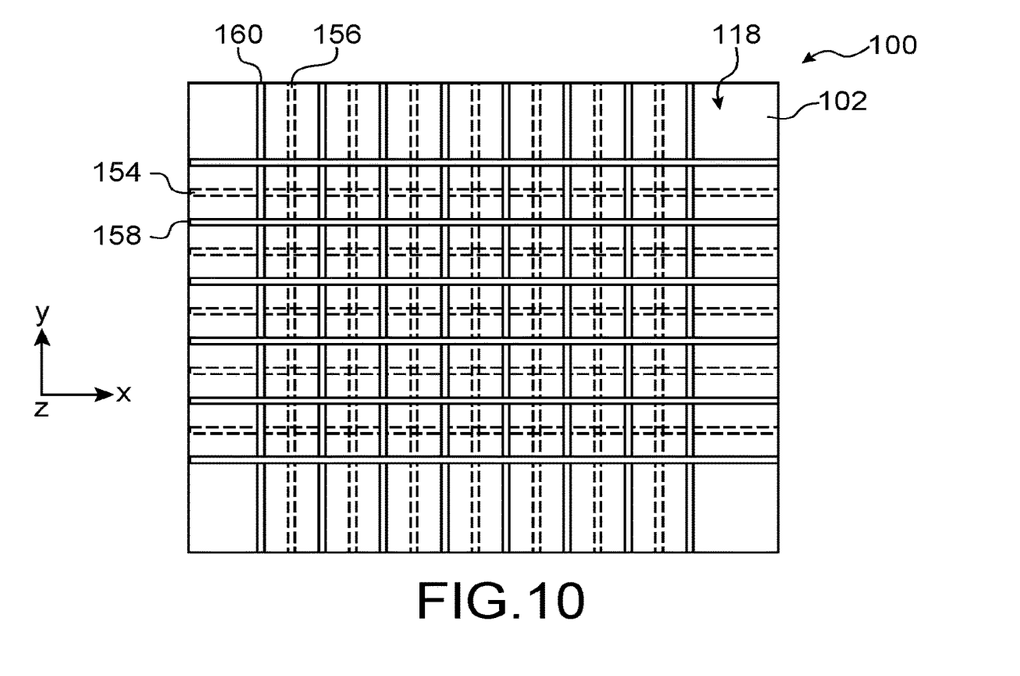
FIG. 10 schematically represents a top view of the quantum device according to an alternative of the first embodiment.

A spin qubit quantum device 100 according to an alternative of the first embodiment is described below in connection with FIG. 10 which corresponds to a top view of the device 100.

Unlike the configuration previously described in connection with FIGS. 1 and 2, the quantum dots are not made in a semiconductor nanowire, but in a semiconductor portion 102 corresponding to a semiconductor layer.

Several first electrostatic control gates, controlling the minimum potential energy levels of the quantum dots, are arranged as rows and are referenced 154, and other first electrostatic control gates are arranged as columns which are referenced 156 also controlling the minimum potential energy levels of the quantum dots and which overlap with the rows 154 of first gates at the intersections between the rows and columns 154, 156 of first electrostatic control gates. In FIG. 9, the rows and columns 154, 156 of first electrostatic control gates are represented as dashed lines because they are disposed under the semiconductor layer on the side of the first face 112 of this layer which is not visible in FIG. 10.

Several second electrostatic control gates, controlling the maximum potential energy levels of the tunnel barriers, are arranged as rows and are referenced 158, and other second electrostatic control gates are arranged as columns and are referenced 160 and overlap the rows of second gates 158 at the intersections between the rows and columns 158, 160 of second electrostatic control gates. The rows and columns 158, 160 of second electrostatic control gates are disposed under the semiconductor layer on the side of the second face 118 of this layer.

In this configuration, the quantum dots are arranged forming a first two-dimensional array in the semiconductor portion 102 and the tunnel barriers are arranged in a second two-dimensional array in the semiconductor portion 102. The quantum dots are located at the intersections of the first control gates 154, 156 and are surrounded by tunnel barriers situated under the second gates 158, 160. Control of the depths of the quantum dots and the heights of the tunnel barriers is achieved by a row-column type addressing performed on the rows and columns of the gates 154, 156, 158, 160.

The different alternative embodiments previously described in connection with FIGS. 1 and 2 may be applied to the device 100 according to the alternative described above in connection with FIG. 10.

The device 100 previously described according to the different embodiments and alternatives may be used in a mode of operation similar to that of one or more series-coupled field effect transistors, and operated in a cryogenic environment, that is, in a cryostat at cryogenic temperatures (below 1 K, or even below 4 K). In such a mode of operation, the electrostatic control gates 107, 109 are used as conventional transistor gates, the biases of which control conductance between the third regions 120 of the structure. In one advantageous mode of operation, the gates located in the vicinity of one of the faces 112 or 118 are statically biased for the purpose of controlling and adjusting the threshold voltage(s) of the transistor(s) comprising the gates located in the vicinity of the other face, 118 or 112 respectively.

The invention claimed is:

1. A spin qubit quantum device, comprising:
a semiconductor portion comprising at least one first region disposed between at least two second regions and juxtaposed to the two second regions;
a first electrostatic control gate disposed in direct contact with the first region of the semiconductor portion, configured to control a minimum potential energy level in the first region, and comprising at least one first portion of electrically conductive material and at least one first gate dielectric disposed in direct contact with a first face of the semiconductor portion, between the first face and the first portion of electrically conductive material; and
second electrostatic control gates, each disposed in direct contact with one of the second regions of the semiconductor portion and configured to control a maximum potential energy level in one of the second regions, and each comprising at least one second portion of electrically conductive material and at least one second gate dielectric disposed in direct contact with a second face, opposite to the first face, of the semiconductor portion, between the second face and the second portion of electrically conductive material,
wherein each of the at least one first and at least two second regions contains only one layer configured to form a quantum dot;
wherein the semiconductor portion is a single portion of semiconductor material extending along a plane in the first direction; and
wherein, in a plane parallel to the first and second faces, a first straight line perpendicular to the first and second faces and passing through a center of the first electrostatic control gate is separated from each second straight line perpendicular to the first and second faces and passing through a center of one of the second electrostatic control gates by a non-zero distance $d_1$.

2. The device according to claim 1, wherein:
the first region of the semiconductor portion is configured to form a quantum dot of a first spin qubit of the device; and
the second regions of the semiconductor portion are configured to form tunnel barriers between which the quantum dot of the first spin qubit is disposed.

3. The device according to claim 2, further comprising electrical charge carrier reservoirs between which the first region(s) and the second regions of the semiconductor portion are disposed.

4. The device according to claim 1, wherein the distance di is greater than or equal to about 10 nm.

5. The device according to claim 4, wherein the distances di, in the plane parallel to the first and second faces of the semiconductor portion, between the first straight line and each of the second straight lines are equal.

6. The device according to claim 1, wherein the second electrostatic control gates are made with a repetition pitch of between 40 nm and 80 nm.

7. The device according to claim 1, wherein:
the semiconductor portion comprises several distinct first regions and each disposed between at least two second regions of the semiconductor portion, each first region being separated from an adjacent first region by one of the second regions; and
several first electrostatic control gates each disposed in direct contact with one of the first regions of the semiconductor portion and configured to control a minimum potential energy level in said one of the first regions of the semiconductor portion.

8. The device according to claim 7, wherein the first electrostatic control gates are made with a repetition pitch of between 40 nm and 80 nm.

9. The device according to claim 1, wherein the first regions are arranged forming a first two-dimensional array in the semiconductor portion and the second regions are arranged forming a second two-dimensional array in the semiconductor portion.

10. The device according to claim 1, further comprising means for applying at least one first electrical potential to each of the first portions of electrically conductive material and at least one second electrical potential, with a value independent of that of the first electrical potential, to each of the second portions of electrically conductive material.

11. The device according to claim 1, wherein the thickness of the semiconductor portion is between 10 nm and 20 nm.

12. The device according to claim 1, wherein the thickness of each of the first and second gate dielectrics is between 2 nm and 15 nm.

13. A method for making a spin qubit quantum device according to claim 1, comprising:
making at least one semiconductor portion comprising at least one first region disposed between at least two second regions and juxtaposed to the two second regions;
making a first electrostatic control gate disposed in direct contact with the first region of the semiconductor portion, configured to control a minimum potential energy level in the first region, and comprising at least one first portion of electrically conductive material and at least one first gate dielectric disposed in direct contact with a first face of the semiconductor portion, between the first face and the first portion of electrically conductive material; and
making second electrostatic control gates, each disposed in direct contact with one of the second regions of the semiconductor portion and configured to control a maximum potential energy level in one of the second regions, and each comprising at least one second portion of electrically conductive material and at least one second gate dielectric disposed in direct contact with a second face, opposite to the first face, of the semiconductor portion, between the second face and the second portion of electrically conductive material,
and wherein the first and second electrostatic control gates are made such that, in a plane parallel to the first and second faces, a first straight line perpendicular to the first and second faces and passing through a centre of the first electrostatic control gate is separated from each second straight line perpendicular to the first and second faces and passing through a centre of one of the second electrostatic control gates by a non-zero distance $d_1$.

14. The method according to claim 13, wherein the first electrostatic control gate and the second electrostatic control gates are made by implementing the following steps of:
making the first gate dielectric and the first portion of electrically conductive material of the first electrostatic control gate on the first face of the semiconductor portion that forms part of a first substrate;
depositing at least one first dielectric layer covering the first electrostatic control gate and parts of the first face of the semiconductor portion not covered with the first electrostatic control gate;

securing the first dielectric layer with a second dielectric layer of a second substrate;

removing the first substrate so as to expose the second face of the semiconductor portion; and making the second gate dielectric and the second portion of electrically conductive material of each of the second electrostatic control gates on the second face of the semiconductor portion.

15. The method according to claim 13, wherein the first and second gate dielectrics are made by implementing thermal oxidation of the semiconductor portion.

16. A spin qubit quantum device, comprising:

a semiconductor portion comprising at least one first region disposed between at least two second regions and juxtaposed to the two second regions;

a first electrostatic control gate disposed in direct contact with the first region of the semiconductor portion, configured to control a minimum potential energy level in the first region, and comprising at least one first portion of electrically conductive material and at least one first gate dielectric disposed in direct contact with a first face of the semiconductor portion, between the first face and the first portion of electrically conductive material; and second electrostatic control gates, each disposed in direct contact with one of the second regions of the semiconductor portion and configured to control a maximum potential energy level in one of the second regions, and each comprising at least one second portion of electrically conductive material and at least one second gate dielectric disposed in direct contact with a second face, opposite to the first face, of the semiconductor portion, between the second face and the second portion of electrically conductive material, wherein, in a plane parallel to the first and second faces, a first straight line perpendicular to the first and second faces and passing through a center of the first electrostatic control gate is separated from each second straight line perpendicular to the first and second faces and passing through a center of one of the second electrostatic control gates by a non-zero distance $d_1$, and wherein a distance $d_2$, in the plane parallel to the first and second faces of the semiconductor portion, between a straight line perpendicular to the first and second faces of the semiconductor portion and passing through a side edge of the first portion of electrically conductive material, and a straight line perpendicular to the first and second faces of the semiconductor portion and passing through a side edge of the second portion of electrically conductive material of one of the second electrostatic control gates, is between 0 and 20 nm.

17. A spin qubit quantum device comprising:

a semiconductor portion comprising at least one first region disposed between at least two second regions and juxtaposed to the two second regions;

a first electrostatic control gate disposed in direct contact with the first region of the semiconductor portion, configured to control a minimum potential energy level in the first region, and comprising at least one first portion of electrically conductive material and at least one first gate dielectric disposed in direct contact with a first face of the semiconductor portion, between the first face and the first portion of electrically conductive material; and second electrostatic control gates, each disposed in direct contact with one of the second regions of the semiconductor portion and configured to control a maximum potential energy level in one of the second regions, and each comprising at least one second portion of electrically conductive material and at least one second gate dielectric disposed in direct contact with a second face, opposite to the first face, of the semiconductor portion, between the second face and the second portion of electrically conductive material, wherein, in a plane parallel to the first and second faces, a first straight line perpendicular to the first and second faces and passing through a center of the first electrostatic control gate is separated from each second straight line perpendicular to the first and second faces and passing through a center of one of the second electrostatic control gates by a non-zero distance $d_1$; and wherein, in a second direction perpendicular to said first direction, said first electrostatic control gate is arranged facing insulating spacers separating the second electrostatic control gates without facing another electrostatic control gate.

* * * * *